United States Patent
Uezono et al.

[19]

[11] Patent Number: 5,872,333

[45] Date of Patent: Feb. 16, 1999

[54] CONNECTOR FIXING CONSTRUCTION

[75] Inventors: Kouichi Uezono; Yasuhito Suzuki, both of Shizuoka, Japan

[73] Assignee: Yazaki Corporation, Tokyo, Japan

[21] Appl. No.: 789,129

[22] Filed: Jan. 28, 1997

[30] Foreign Application Priority Data

Jan. 31, 1996 [JP] Japan .................................. 8-015496
Sep. 30, 1996 [JP] Japan .................................. 8-258952

[51] Int. Cl.⁶ .................................................. H01H 9/02
[52] U.S. Cl. ................................ 174/55; 174/59; 174/66; 439/76.2
[58] Field of Search ................................ 174/59, 54, 55, 174/66, 50.54; 220/3.8, 241; 361/736, 752, 760; 439/76.2, 76.1, 949

[56] References Cited

U.S. PATENT DOCUMENTS

| | | | |
|---|---|---|---|
| 904,458 | 11/1908 | Scism | 220/3.8 |
| 4,346,254 | 8/1982 | Borin et al. | 174/59 X |
| 4,703,397 | 10/1987 | Minoura et al. | 439/76.2 X |
| 4,799,893 | 1/1989 | Ogawa et al. | 439/76.2 |
| 4,850,884 | 7/1989 | Sawai et al. | 439/76.2 |
| 4,869,675 | 9/1989 | Ogawa | 439/76.2 |
| 4,909,745 | 3/1990 | Hayashi | 439/76.2 |
| 5,475,566 | 12/1995 | Rada et al. | 361/736 |

FOREIGN PATENT DOCUMENTS

| | | | |
|---|---|---|---|
| 318863 | 6/1989 | European Pat. Off. | 439/76.2 X |
| 736704 | 5/1943 | Germany | 174/59 X |
| 461297 | 2/1992 | Japan | 361/752 X |

*Primary Examiner*—Dean A. Reichard
*Attorney, Agent, or Firm*—Sughrue, Mion, Zinn, Macpeak & Seas, PLLC

[57] ABSTRACT

In a connector fixing construction, connectors are mounted on a printed circuit board, and wall portions, covering peripheral surfaces of the connectors, respectively, are formed on a cover covering the printed circuit board. Therefore, even if a lateral external force acts on the connector when a mating connector is inserted into and removed from the connector, the connector is prevented from being moved laterally, thereby certainly preventing damage, such as a crack, to solder portions by which terminals of the connector are connected to a circuit pattern.

5 Claims, 7 Drawing Sheets

CONNECTOR FIXING CONSTRUCTION

BACKGROUND OF THE INVENTION

This invention relates to a construction of fixing a connector through which signals are fed to and from a printed circuit board and through which electric power is supplied to the printed circuit board, and more particularly to a connector fixing construction suited for a junction block in which a printed circuit board is connected integrally to a board having bus bars and connectors, and the printed circuit board and the board are covered with a cover.

Usually, many electronic devices for effecting various controls are mounted on an automobile or the like, and therefore many connectors have been used to connect the electronic devices to wire harnesses and to connect the wire harnesses together. Also, there has been used a junction block in which the electronic devices and the connectors are mounted in a generally concentrated manner to provide a unitary construction.

A connector fixing construction of a conventional junction block (hereinafter referred to merely as "JB") will now be described with reference to FIGS. 9 through 13. As shown in FIGS. 9 and 10, in the JB 41, a printed circuit board (hereinafter referred to merely as "PCB") 42 is fixedly mounted on a board 44 through spacers 43. Connectors 45 and various parts P including resistors, capacitors and shielded coils, are mounted on the PCB 42.

Various parts P are mounted on the board 44, and bus bars 47 and 48 and so on are also mounted on the board 44. Although only part of the bus bar 47 is shown in FIG. 10, ends of the bus bar 47 serve as external connection terminals for a fuse cavity 49 when the JB 41 is assembled. Ends of the bus bar 48 serve as external connection terminals for connectors 51 when the JB 41 is assembled.

When the JB 41 is assembled as shown in FIG. 9, the upper sides of the PCB 42 and the board 44 are entirely covered with a cover 52 of a synthetic resin while the lower sides thereof are covered with a cover 53. A fitting side of each connector 45 is disposed generally flush with an opening formed through an upper wall of the cover 52, and hence is exposed to the exterior through this opening. The fuse cavity 49 and the connectors 51 are projected from the upper surface of the cover 52.

The internal structure of the JB 41 will be described with reference to FIGS. 11 and 12. FIG. 11 is a cross-sectional view taken along the line XI—XI of FIG. 9, and FIG. 12 is an enlarged, cross-sectional view of an important portion of FIG. 11.

As shown in FIG. 11, a bus bar 54, extended through the board 44, is connected at one end to a circuit pattern 46, and the other end of the bus bar 54 is electrically connected to the bus bar 47 and so on through a conductive member 55. As shown in FIG. 12, the circuit pattern 46 is formed on a lower surface of the PCB 42, and terminals of the various parts P and terminals 45a of the connectors 45 are soldered to the circuit pattern 46.

As shown in FIG. 12, the connectors 45, the PCB 42 and the cover 52 are arranged such that the terminals 45a of each connector 45 extend through the PCB 42, and are soldered at their distal ends to the circuit pattern 46. The connector 45 is fixedly secured or fastened at its central portion to the PCB 42 by a screw 56. A large gap G is formed between the peripheral edge of the opening, formed through the cover 52, and the peripheral surface of the connector 45, and the two are normally out of contact with each other.

When connecting the connector 45 to a mating connector (not shown), the mating connector is inserted at its front end into the fitting side of the connector 45, and is pushed downward to be fitted in the connector 45. When removing or withdrawing the mating connector from the connector 45, the mating connector is pulled upwardly to be withdrawn from the connector 45.

However, in order to prevent incomplete contact and so on, terminals of the mating connector are press-connected respectively to the terminals of the connector 45, and therefore a suitable degree of frictional resistance develops therebetween, and therefore the mating connector can not be easily connected to and removed from the connector 45 merely by urging the mating connector downwardly and upwardly, and particularly when removing the mating connector, in some cases, it is forcibly swung to be withdrawn from the connector 45.

More specifically, as shown in FIG. 12, when withdrawing the mating connector from the connector 45, the connector 45 is forcibly swung in directions indicated by arrows B since the large gap G is formed between the connector 45 and the peripheral edge of the opening in the cover 52. As a result, a load is applied to the area of soldering between the terminals 45a and the circuit pattern 46, so that the solder portions may be cracked. If this occurs, the connection between the terminals 45a and the circuit pattern 46 becomes incomplete, so that the proper circuit operation fails to be carried out.

Further, as shown in FIG. 13, when connecting the mating connector to the connector 45 by pushing the former into the latter, the PCB 42 is deformed from a horizontal condition (indicated in phantom) into an arcuate or curved condition indicated in solid lines. When withdrawing the mating connector from the connector 45, the PCB 42 is deformed upwardly from the position (indicated in phantom) into an arcuate condition. As a result, a load is applied to the solder portions when inserting and removing the mating connector, so that the above-mentioned problems have been encountered.

SUMMARY OF THE INVENTION

It is an object of this invention to provide a connector fixing construction in which when connecting and disconnecting a mating connector relative to a connector mounted on a printed circuit board, solder portions are prevented from being cracked.

The above object of the invention has been achieved by connector fixing constructions mentioned in the following paragraphs (1) to (5):

(1) A connector fixing construction comprising a connector mounted on a printed circuit board, and a cover covering the printed circuit board, the cover having an opening through which a fitting side of the connector is exposed; characterized in that a wall portion extends downwardly from that portion of the cover defining a peripheral edge portion of the opening, and surrounds a peripheral surface of the connector.

In this connector fixing construction, the wall portion extends downwardly in surrounding relation to the peripheral surface of the connector, and therefore even if a lateral external force acts on the connector when the mating connector is inserted into and removed from the connector, the wall portion prevents the connector from moving, so that damage to solder portions is certainly prevented.

(2) In the connector fixing construction according to the above paragraph (1), there is provided a support member having a support portion of a convex configuration disposed in close proximity to a predetermined portion of a soldering surface of the printed circuit board facing away from a part-mounting surface thereof having the connector mounted thereon.

In this connector fixing construction, there is provided the support member having the support portion of a convex configuration disposed in close proximity to the soldering surface of the printed circuit board facing away from the part-mounting surface thereof having the connector mounted thereon. Therefore, even if the printed circuit board is urged or pressed downward when the mating connector is inserted into the connector, the printed circuit board is abutted against the support portion, and is positively prevented from being flexed or deformed downwardly.

(3) In the connector fixing construction according to the above paragraph (1), the wall portion, formed on the cover, is extended to a position close to the printed circuit board.

In this connector fixing construction, the wall portion, formed on the cover, is extended to the position close to the printed circuit board. Therefore, the wall portion prevents the connector from being laterally moved, and also positively prevents the printed circuit board from being flexed or deformed upwardly. Therefore, with this arrangement and also with the arrangement of the above paragraph (2), damage to the solder portions is more certainly prevented.

(4) In the connector fixing construction according to the above paragraph (1), holder ribs are formed on an inner surface of the wall portion, and cover part of an upper surface of the connector, the holder ribs being provided at such positions that they will not interfere with a mating connector when the mating connector is inserted into and removed from the connector.

In this connector fixing construction, the holder ribs are formed on the inner surface of the wall portion, and cover part of the upper surface of the connector, the holder ribs being provided at such positions that they will not interfere with the mating connector when the mating connector is inserted into and removed from the connector. Therefore, as in the connector fixing construction of the above paragraph (3), the wall portion prevents the connector from being laterally moved, and the upward flexing or deformation of the printed circuit board is certainly prevented when withdrawing the mating connector from the connector. Therefore, with this arrangement and with the arrangement of the above paragraph (2), damage to the solder portions is more certainly prevented.

(5) In the connector fixing construction according to the above paragraph (1), a fixing boss is formed on the connector, and is held against the printed circuit board, and a screw fixing portion is formed on a lid member covering a soldering surface of the printed circuit board, and is held against the soldering surface, and the connector and the lid member are fastened together by a screw, with the printed circuit board held therebetween.

In this connector fixing construction, the connector and the lid member are fastened together by the screw, with the printed circuit board held therebetween. Therefore, the printed circuit board will not be flexed or deformed when the mating connector is inserted into and removed from the connector, and a load applied to the solder portions is reduced, thereby more certainly preventing damage to the solder portions.

DETAILED DESCRIPTION OF THE INVENTION

Figure 1:
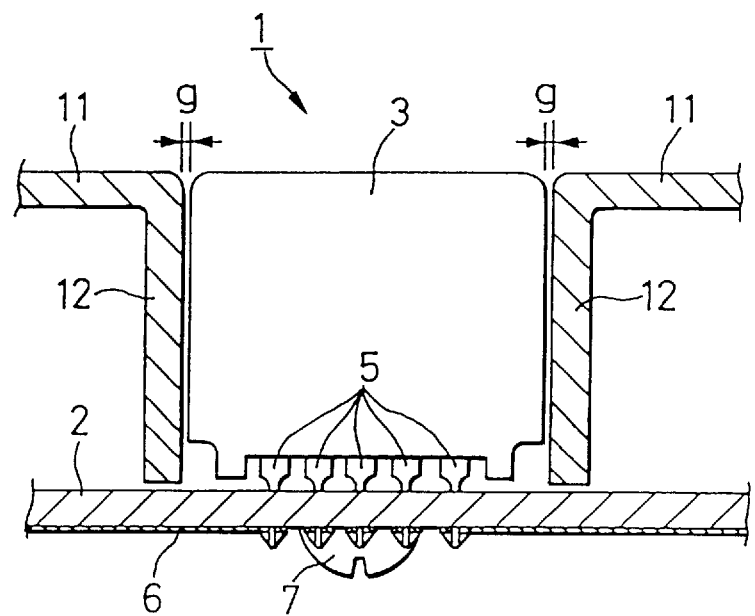
FIG. 1 is an enlarged cross-sectional view showing an important portion of a first embodiment of a connector fixing construction of the present invention.
Figure 2:
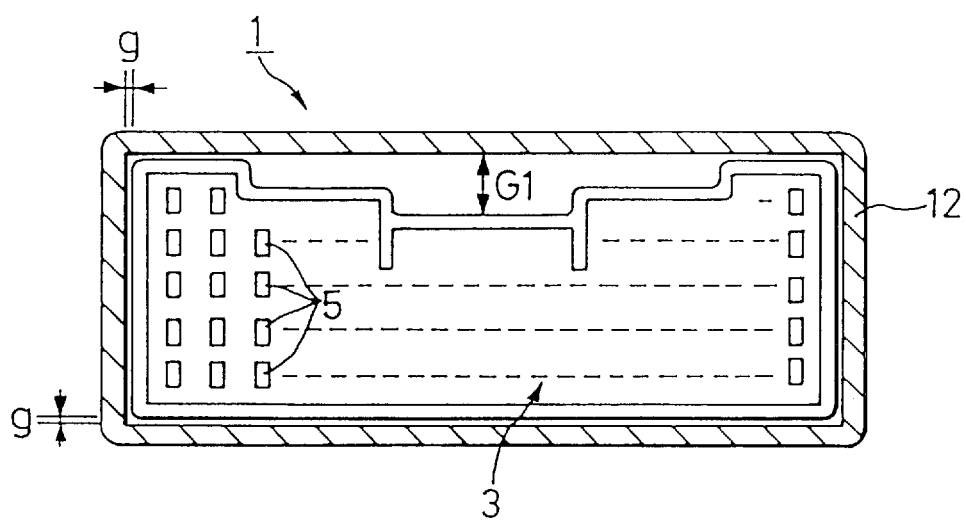
FIG. 2 is a plan view showing an important portion of the connector fixing construction of FIG. 1.

A first embodiment of a connector fixing construction of the present invention will now be described with reference to FIGS. 1 and 2. FIGS. 9 to 13, used for the explanation of the conventional construction, will be used also in the description of the embodiments. FIG. 1 is an enlarged cross-sectional view showing an important portion of the connector fixing construction of the invention, and FIG. 2 is a plan view showing an important portion of the connector fixing construction.

As shown in FIG. 1, the connector fixing construction 1 of this embodiment comprises a flat printed circuit board (PCB) 2 having a circuit pattern 6 formed thereon, connectors 3 each having a plurality of terminals 5 soldered to the PCB 2, and a cover 11 covering the PCB 2. The terminals 5, projecting from the lower side of the connector 3, extend through the PCB 2, and are connected by soldering to the circuit pattern 6 formed on a soldering surface thereof. The connector 3 is fastened to the PCB 2 by a screw 7, and the connector 3 is firmly fixed to the PCB 2 by this screw and the solder.

A wall portion 12 extends downwardly from the cover 11 at a peripheral edge portion of each opening (through which a fitting side of the associated connector 3 is exposed to the exterior) formed through the cover 11, to a position close to the PCB 2, and surrounds a peripheral surface of the connector 3. Namely, as shown in FIG. 2, the wall portion 12 surrounds the entire periphery of the connector 3. A large insertion gap G1 for receiving a retaining portion of a mating connector is formed between the peripheral surface of the connector 3 and the wall portion 12 at part of the periphery of the connector 3. However, only a small gap "g" is formed between the connector 3 and the wall portion 12 except that region where the insertion gap G1 is provided.

Operations, effected when connecting and disconnecting the mating connector relative to the connector 3, will now be described. As shown in FIG. 1, the mating connector is inserted into the fitting side of the connector 3 from the upper side, and is connected to the connector 3. At this time, even if trying to insert the mating connector into the connector 3 while forcibly swinging the mating connector laterally since a frictional resistance develops between the terminals of the two connectors, the connector 3 is prevented from being laterally moved since the entire periphery of the connector 3 is surrounded by the wall portion 12. Therefore, the mating connector is urged only substantially vertically, and a lateral load will not be applied to the solder portions by which the terminals 5 are connected to the circuit pattern 6, and therefore damage, such as a crack, to the solder portions is certainly prevented.

When withdrawing the mating connector from the connector 3, the connector 3 is prevented from being forcibly swung laterally since the connecter 3 is surrounded by the wall portion 12 over the entire periphery thereof; otherwise, this forcible swinging movement would be effected so as to disengage the terminals of the mating connector, press-connected respectively to the terminals of the connector 3, therefrom.

The wall portion 12 is extended to the position close to the PCB 2, and therefore the upward deformation or flexing of the PCB 2 is prevented by the lower end of the wall portion 12 when withdrawing the mating connector from the connector 3. As a result, even when the mating connector is withdrawn, a load will not be applied to the solder portions by which the terminals 5 are connected to the circuit pattern 6, and therefore damage to the solder portions is certainly prevented.

Figure 3:
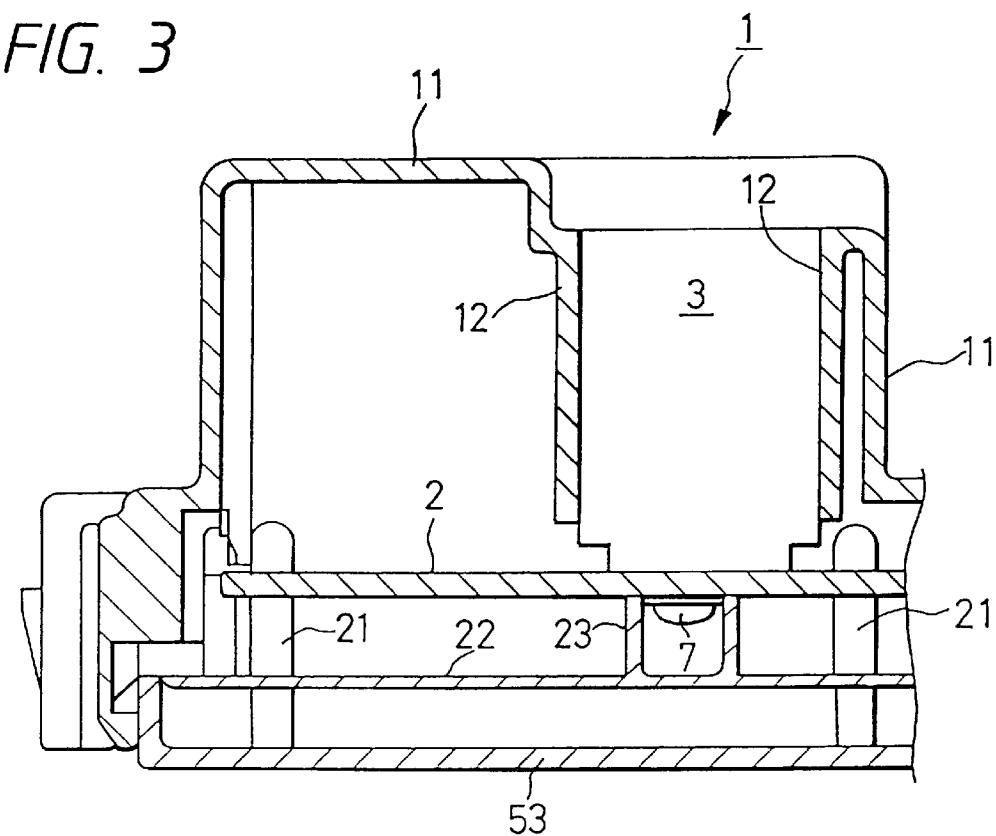
FIG. 3 is a cross-sectional view showing a structure below a printed circuit board of the construction of FIG. 1.
Figure 4:
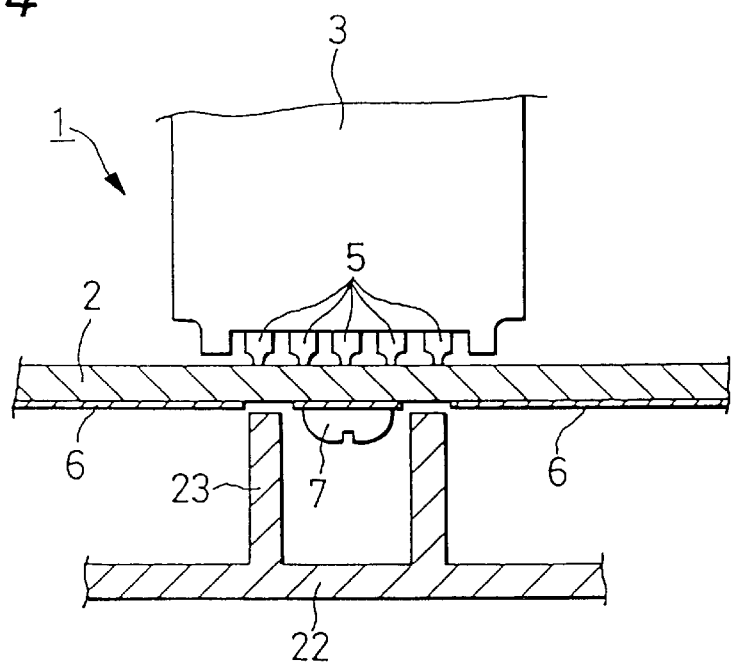
FIG. 4 is an enlarged cross-sectional view of an important portion FIG. 3.

Next, in the connector fixing construction of this embodiment, an arrangement of preventing the flexing of the PCB when connecting and disconnecting the mating connector relative to the connector will be described with reference to FIGS. 3 to 5. FIG. 3 is a cross-sectional view of the construction of preventing the flexing of the PCB when connecting and disconnecting the mating connector, FIG. 4 is an enlarged cross-sectional view of an important portion, and FIG. 5 is a plan view of the portion shown in FIG. 3.

As shown in FIG. 3, a support member 22 is provided below the PCB 2 through spacers 21. Hollow cylindrical support portions 23 are formed respectively on those portions of an upper surface of the support member 22 where the connectors 3 are fastened with the screws 7, each of the cylindrical support portions 23 surrounding a respective one of the screws 7. The upper ends of the support portions 23 are disposed in close proximity to the soldering surface of the PCB 2.

Figure 5:
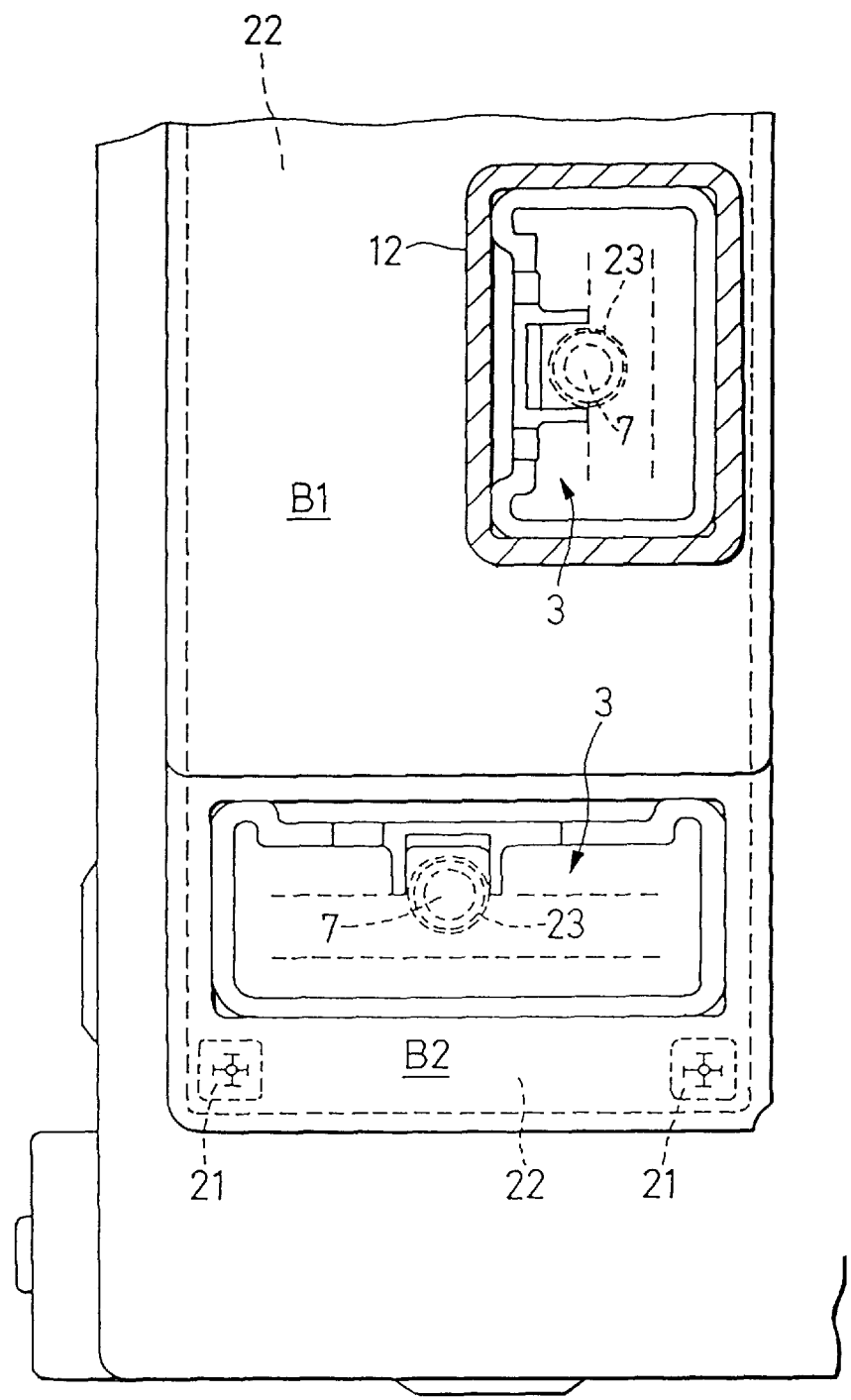
FIG. 5 is a plan view of an important portion in FIG. 3.

The support member 22 is in the form of a flat plate, and underlies that portion of the PCB 2 having the connectors 3 mounted thereon, over an entire area thereof, within a junction block (JB) 1, as indicated by a broken line in FIG. 5. The support portions 23 are formed in surrounding relation respectively to the screws 7 provided respectively at generally central portions of the two connectors 3.

The lower ends of each wall portion 12 are extended to the position close to the PCB 2. FIG. 5 shows those portions relevant to the connectors 3 within the JB 1, but the wall portion 12 in an upper block B1 (FIG. 5) is shown in cross-section for convenience' sake while a lower block B2 is shown in a plan view.

When the mating connector is inserted into the connector 3, the connector 3 is urged downward, and therefore the PCB 2 is also urged downward. However, since the support portion 23 is provided in close proximity to the PCB 2, the soldering surface of the PCB 2 is abutted against the support portion 23, so that the PCB 2 will not be flexed downward beyond the support portion 23. As a result, a load will not be applied to the solder portions by which the terminals 5 of the connector 3 are connected to the circuit pattern 6, and therefore damage, such as a crack, to the solder portions is prevented, thereby enhancing the reliability of the JB1.

Next, the operation of withdrawal of the mating connector from the connector 3 will be described. In the above embodiment, the support member 22 and the support portions 23 are provided, and besides the wall portions 12 each surrounding the associated connector 3 are extended to the position close to the PCB 2. Therefore, when withdrawing the mating connector from the connector 3, the lower end of the wall portion 12 prevents the PCB 2 from being flexed upward. Therefore, a load due to the forcible swinging of the connector 3 will not be applied to the solder portions on the PCB 2, and besides the upward flexing is prevented. This, together with the provision of the support portion 23, achieves double protection, and therefore all of the problems, encountered with the conventional construction, are overcome.

Figure 6:
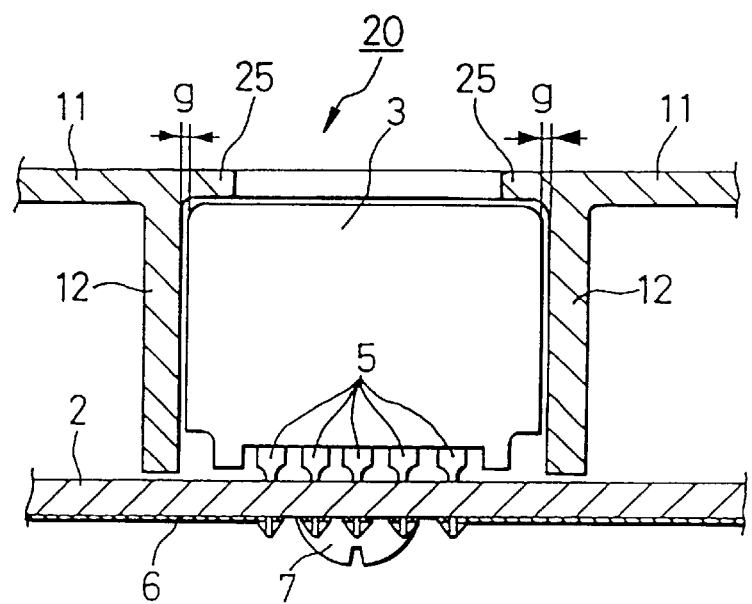
FIG. 6 is an enlarged cross-sectional view showing an important portion of a second embodiment of the invention.
Figure 7:
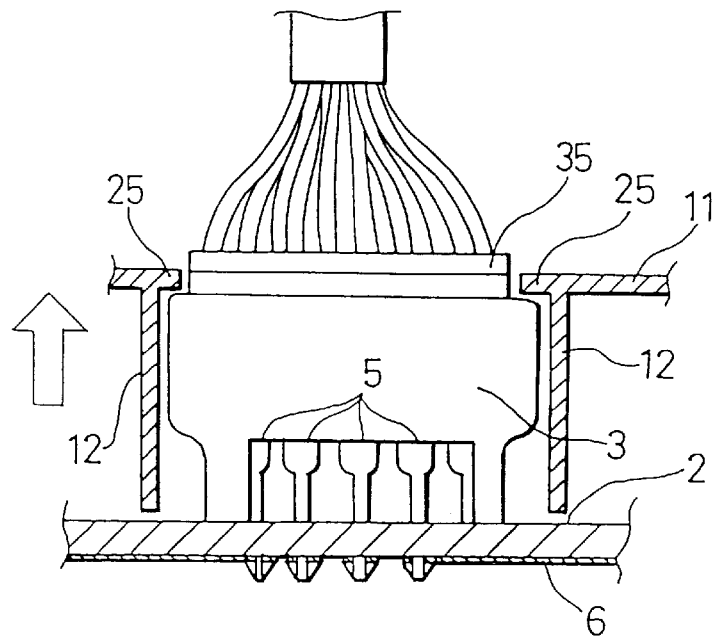
FIG. 7 is a view explanatory of the operation in FIG. 6.

Next, a second embodiment of a connector fixing construction of the invention will be described with reference to FIGS. 6 and 7. This embodiment differs from the first embodiment in that a load will not be applied to the solder portions, utilizing a cover covering an upper portion of the connector fixing construction. Those portions of this embodiment, performing the same functions as those of the first embodiment, will be designated by identical reference numerals.

In this embodiment, a wall portion 12 extends downwardly from the cover 11 at a peripheral edge portion of each opening (through which a fitting side of an associated connector 3 is exposed to the exterior) formed through a cover 11, to a position close to a PCB 2, and surrounds a peripheral surface of the connector 3. Namely, the wall portion 12 surrounds the entire periphery of the connector 3. Holder ribs 25 are formed on an inner surface of the wall portion 12, and cover part of the upper surface of the connector 3. The holder ribs 25 are provided at such positions that they will not interfere with a mating connector 35 when the mating connector 35 is inserted into and removed from the connector 3.

Therefore, as in the first embodiment, the wall portion 12 prevents the connector 3 from being moved or swung laterally, and also the upward flexing of the PCB is certainly prevented when withdrawing the mating connector 35 from the connector 3. Therefore, with this arrangement and also with the arrangement as described above for the first embodiment, the solder portions are more certainly prevented from damage.

Figure 8:
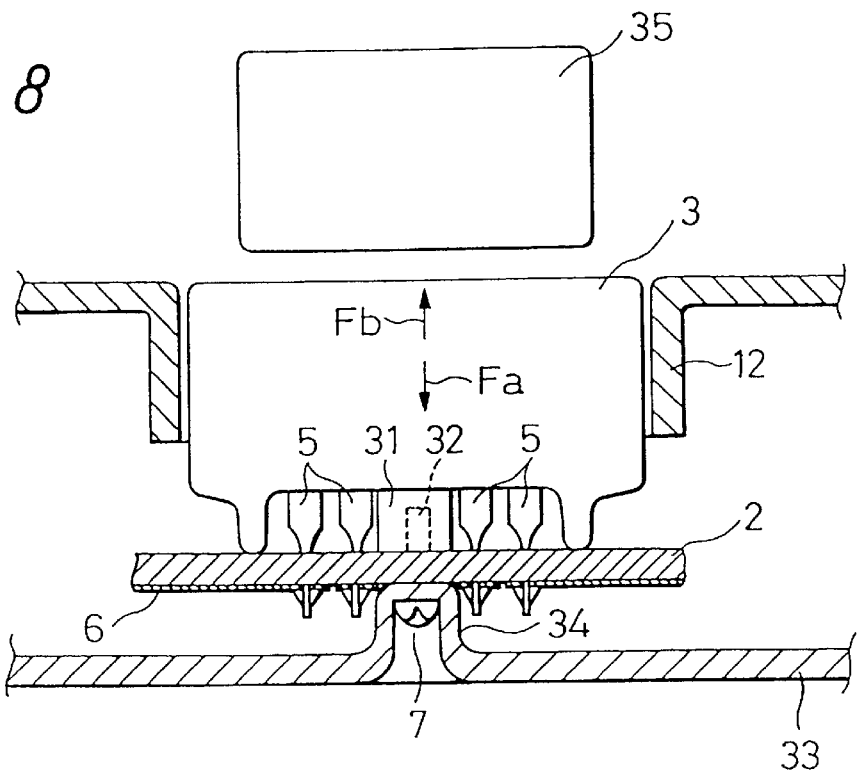
FIG. 8 is an enlarged cross-sectional view showing an important portion of a third embodiment of the invention.
Figure 9:
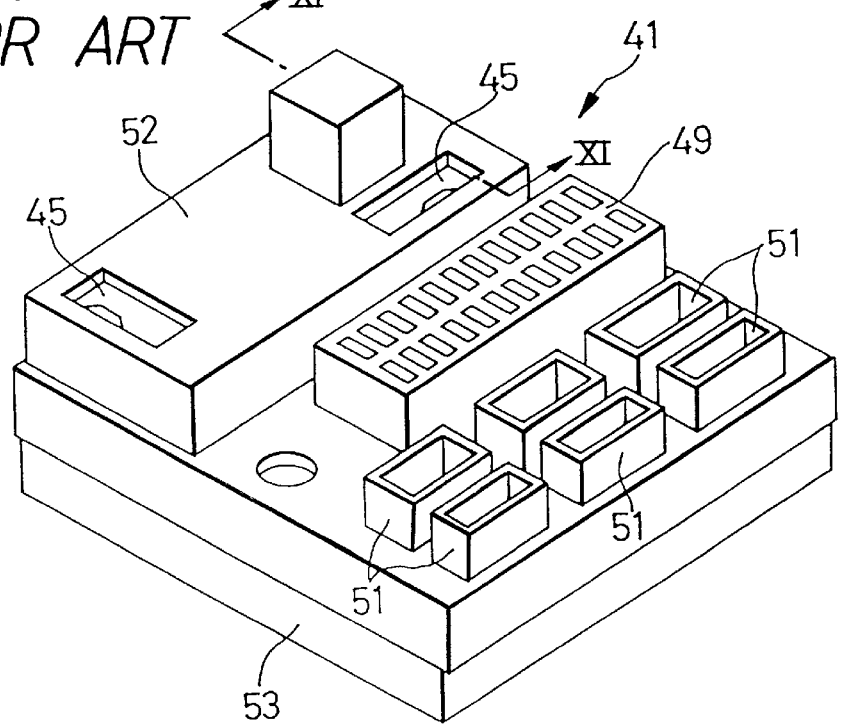
FIG. 9 is a perspective view of a conventional junction block.
Figure 10:
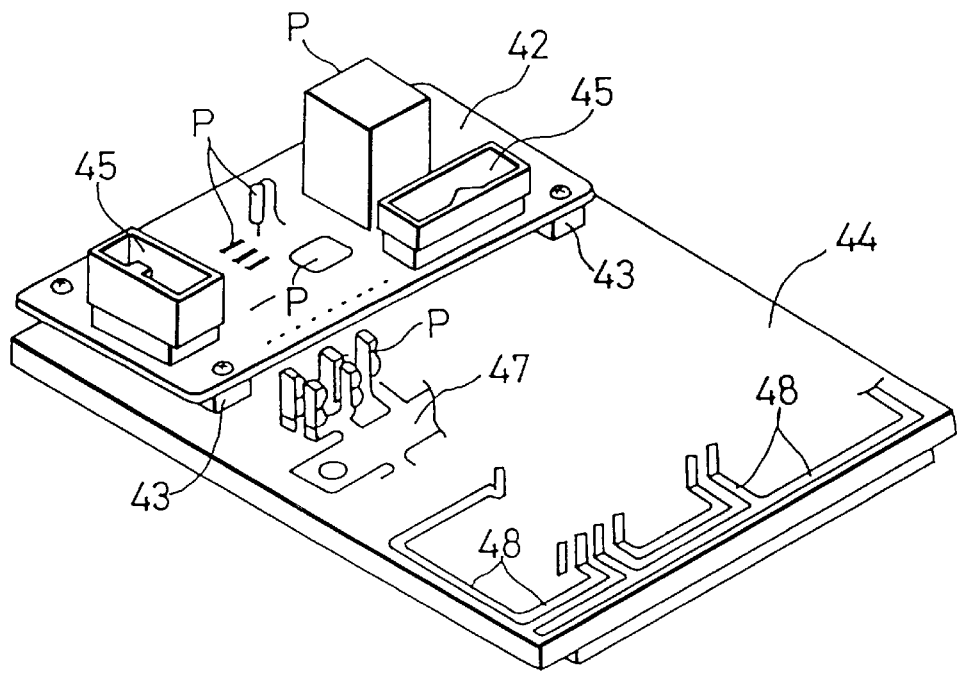
FIG. 10 is a perspective view of a connector fixing construction in FIG. 9.
Figure 11:
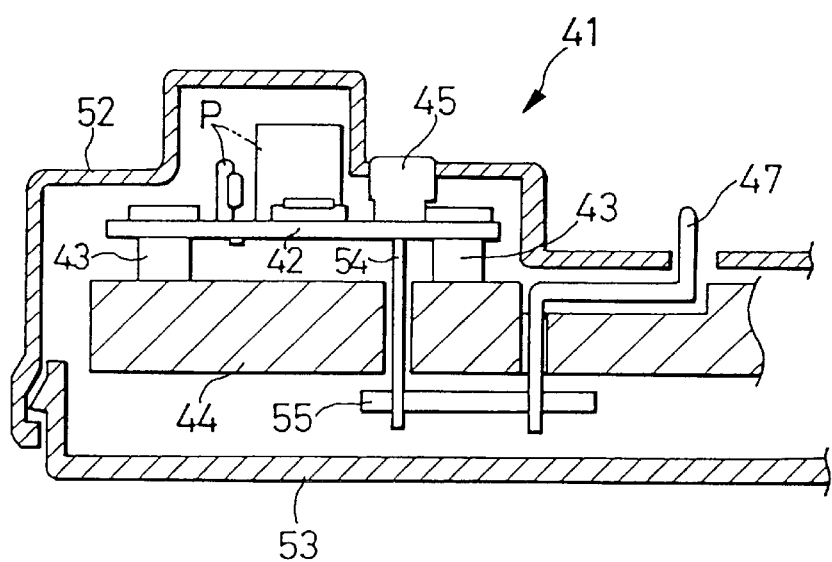
FIG. 11 is a cross-sectional view of an important portion in FIG. 9.
Figure 12:
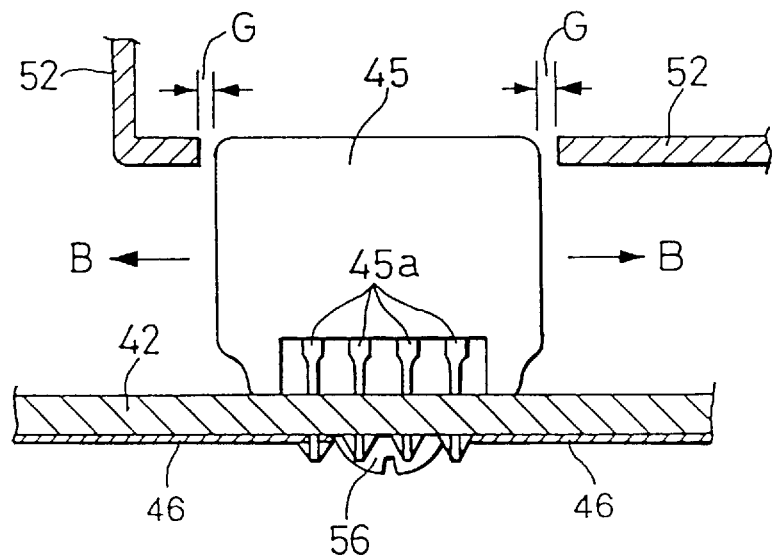
FIG. 12 is an enlarged cross-sectional view of an important portion in FIG. 11.
Figure 13:
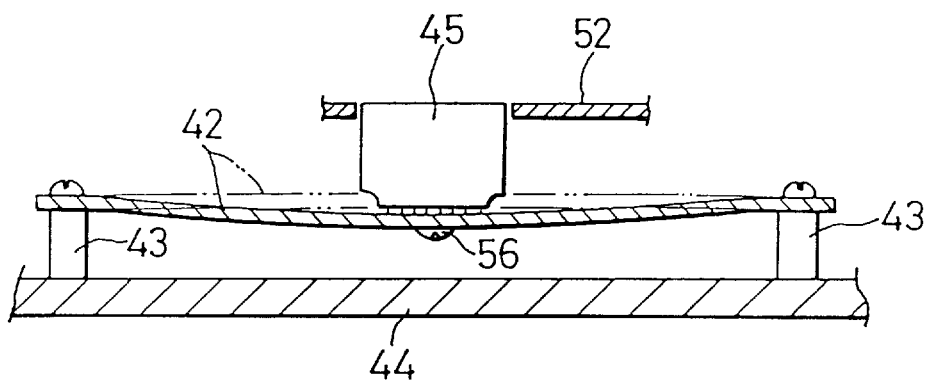
FIG. 13 is a schematic cross-sectional view showing the flexing or deformation of a printed circuit board in a conventional junction box.

Next, a third embodiment of a connector fixing construction of the invention will be described with reference to FIG. 8. This embodiment differs from the first embodiment in that a load will not be applied to the solder portions, utilizing a lid member covering a lower portion of the connector fixing construction. Those portions of this embodiment, performing the same functions as those of the first embodiment, will be designated by identical reference numerals.

In this embodiment, a fixing boss 31 of a predetermined length is formed on a lower surface of a connector 3, and terminals 5 project from this lower surface. A screw hole 32 (indicated by a broken line) is formed in the fixing boss 31. When the terminals 5 are soldered to a circuit pattern 6 on a PCB 2, a lower end of the fixing boss 31 is held in contact with an upper surface of the PCB 2.

A lower surface of the PCB 2 is covered with the lid member 33 so as to prevent dust from adhering to this lower surface. In this embodiment, screw fixing portions 34 of a convex shape are formed respectively at those portions of the lid member 33, corresponding to the fixing bosses 31. The screw fixing portion 34 has a height corresponding to the distance between the lid member 33 and the PCB 2, and when the lid member 33 is fixedly mounted in position, distal ends of the screw fixing portions 34 are disposed in close proximity to the lower surface of the PCB 2.

In the above connector fixing construction, when mounting the connectors 3, each connector 3 is located in a predetermined position on the PCB 2, and the terminals 5 are passed through the PCB 2, and are soldered to the circuit pattern 6 formed on the PCB 2. The amount of extending of the terminals 5 from the lower surface of the PCB 2 is determined by the height of the fixing boss 31 held against the PCB 2. When the lid member 33 is mounted after the terminals 5 are soldered to the circuit pattern 6, the fixing bosses 31 are opposed respectively to the screw fixing portions 34 through the PCB 2.

In this condition, screws 7 are passed respectively through the screw fixing portion 34 from the lower side, and are tightened to fix the lid member 33 to the fixing bosses 31. As a result, the connectors 3, the PCB 2 and the lid member 33 are fastened together.

In this construction, when connecting a mating connector 35 to the connector 3, force Fa acts on the connector 3. However, since the connector is fixed to the PCB 2, and also fixed to the lid member 33, a load applied to the solder portions on the terminals 5 is reduced. This, together with the provision of a wall portion 12, prevents the solder portions from being cracked.

When withdrawing the mating connector 35 from the connector 3, force Fb acts on the connector 3. In this case, also, a load applied to the solder portions is reduced since the connector 3 is fixed to the PCB 2 and also fixed to the lid member 33. This, together with the provision of the wall portion 12, prevents the solder portions from being cracked.

The present invention is not to be limited to the above embodiments, and various modifications can be made. For example, in the third embodiment, reinforcement ribs may be formed on the lid member 33 to extend radially from the screw fixing portion 34, or may be provided in the form of a grid so as to increase the strength of the lid member 33 to prevent the flexing or deformation thereof. Each of the support portions 23 does not always need to be provided in surrounding relation to the screw 7, but may be formed at other positions.

As described above, in the connector-fixing constructions of the invention, the connectors are mounted on the printed circuit board, and the wall portions, covering the peripheral surfaces of the connectors, respectively, are formed on the cover covering the printed circuit board.

Therefore, even if a lateral external force acts on the connector when the mating connector is inserted into and removed from the connector, the lateral movement of the connector is prevented by the wall portion. Therefore, a load is not applied to the solder portions by which the terminals of the connector are connected to the circuit pattern, and damage, such as a crack, to the solder portions is prevented, thereby providing the highly-reliable connector fixing construction.

There is provided the support member having the support portions of a convex configuration each disposed in close proximity to the soldering surface of the printed circuit board facing away from the part-mounting surface thereof having the connectors mounted thereon.

Therefore, even if the printed circuit board is urged or pressed downward when fitting the mating connector into the connector, the printed circuit board is abutted against the support portion, and is certainly prevented from being flexed or deformed downward. Therefore, a load is not applied to the solder portions by which the terminals of the connector are connected to the circuit pattern, and damage, such as a crack, to the solder portions is prevented.

Each of the wall portions is extended to the position close to the printed circuit board. Therefore, the lateral movement of the connector is prevented, and also the upward flexing or deformation of the printed circuit board is prevented when withdrawing the mating connector from the connector. Therefore, this, together with the provision of the support member, more certainly prevents damage to the solder portions, and the reliability of a device, to which this connector fixing construction is applied, is enhanced.

The holder ribs are formed on the inner surface of the wall portion, and cover part of the upper surface of the connector, and the holder ribs are provided at such positions that they will not interfere with the mating connector when the mating connector is inserted into and removed from the connector. The wall portion prevents the connector from laterally moving, and also certainly prevents the upward flexing or deformation of the printed circuit board. Therefore, this, together with the provision of the support member, more certainly prevents damage to the solder portions.

The printed circuit board is held between each of the connectors and the lid member, and in this condition each connector is fastened to the lid member by the screw. Therefore, the strength of the printed circuit board is enhanced, and the printed circuit board will not be flexed or deformed when the mating connector is inserted into and withdrawn from the connector, so that a load, applied to the solder portions, is reduced, thereby more certainly preventing damage to the solder portions.

What is claimed is:

1. A connector fixing construction, comprising:

a printed circuit board to which a connector is attached, the connector having a predetermined height; and a cover covering said printed circuit board, said cover having an opening through which a fitting side of the connector is exposed;

wherein a wall portion of said cover extends downwardly from a peripheral edge portion of the opening of said cover toward said printed circuit board, and surrounds a peripheral surface of the connector so that a small gap is formed between said wall portion and at least three sides of the connector and said wall portion is substantially parallel to the peripheral surface of the connector throughout said predetermined height of the connector, wherein the small gap is sufficiently narrow so as to prevent any substantial lateral movement of the connector during engagement or disengagement with a guard connector.

2. A connector fixing construction according to claim 1, further comprising a support member having a support portion of a hollow cylindrical shape disposed in close proximity to a portion of a soldering surface of said printed circuit board opposite to a part-mounting surface thereof to which the connector is attached.

3. A connector fixing construction according to claim 1, wherein said wall portion extends from said cover, is extended to a position close to said printed circuit board.

4. A connector fixing construction according to claim 1, further comprising holder ribs disposed on an upper portion of an inner surface of said wall portion, said holder ribs covering a part of an upper surface of said connector, and being provided at such positions that they will not interfere with a mating connector when the mating connector is inserted into and removed from said connector.

5. A connector fixing construction according to claim 1, further comprising:

a fixing boss disposed on the connector, said fixing boss being held against said printed circuit board; and a lid member covering a soldering surface of said printed circuit board and having a screw fixing portion, said screw fixing portion being held against said soldering surface to be positioned opposite said fixing boss with said printed circuit board therebetween, wherein said connector and said lid member are fastened together by a screw, with said printed circuit board held therebetween.

* * * * *